(12) United States Patent
Kawamoto (10) Patent No.: US 9,995,771 B2
(45) Date of Patent: *Jun. 12, 2018

(54) SHUNT RESISTOR

(71) Applicant: DENSO CORPORATION, Kariya, Aichi-pref. (JP)

(72) Inventor: Ippei Kawamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/316,595

(22) PCT Filed: Aug. 7, 2015

(86) PCT No.: PCT/JP2015/003977
§ 371 (c)(1),
(2) Date: Dec. 6, 2016

(87) PCT Pub. No.: WO2016/035256
PCT Pub. Date: Mar. 10, 2016

(65) Prior Publication Data
US 2017/0192038 A1    Jul. 6, 2017

(30) Foreign Application Priority Data

Sep. 3, 2014    (JP) ................................ 2014-179482

(51) Int. Cl.
*G01R 1/20* (2006.01)
*G01R 15/14* (2006.01)
*G01R 31/36* (2006.01)

(52) U.S. Cl.
CPC ........... *G01R 15/146* (2013.01); *G01R 1/203* (2013.01); *G01R 31/3696* (2013.01)

(58) Field of Classification Search
CPC ...... G01R 15/14; G01R 15/146; G01R 1/203; G01R 31/3696; H01L 24/34; H01L 24/41;
(Continued)

(56) References Cited

U.S. PATENT DOCUMENTS 7,573,274 B2 *  8/2009  Aratani ................. G01R 1/203
                                                        324/117 R
9,237,653 B2 *  1/2016  Kondou ................ G01R 1/203
(Continued)

FOREIGN PATENT DOCUMENTS

JP          2562410 B2     12/1996
JP         2004-221160 A    8/2004
(Continued)

OTHER PUBLICATIONS

U.S. Appl. No. 15/317,240, filed Dec. 8, 2016, Umezawa.

*Primary Examiner* — Thang Le
(74) *Attorney, Agent, or Firm* — Posz Law Group, PLC (57) ABSTRACT

A shunt resistor, at least a part of which has a resistive element with pre-set resistivity, is configured to bridge between two electrodes and detect a current value of a current flowing between the electrodes by detecting a voltage drop in the resistive element. The shunt resistor includes two connecting parts affixed to the electrodes via a conductive adhesive, respectively, and the connecting parts electrically connected to the affixed electrodes, a bridging part bridging between the connecting parts by being extended from one of the connecting parts to the other one of the connecting parts, and two bonding wires used to detect a voltage drop in the resistive element. The bonding wires are bonded to the bridging part.

13 Claims, 6 Drawing Sheets

(58) Field of Classification Search
CPC .............. H01L 24/37; H01L 24/40; H01L 2224/40245; H01L 2224/48247; H01L 2224/40095; H01L 2224/84801; H01L 2224/40247; H01L 2224/37147; H01L 2924/12042; H01L 2924/17787; H01L 2924/1301; H01L 2924/1306; H01L 2924/13091; H01C 1/144

See application file for complete search history.

(56) References Cited

U.S. PATENT DOCUMENTS

| | | | |
|---|---|---|---|
| 9,660,404 B2 * | 5/2017 | Kameko | ............... H01C 1/14 |
| 2003/0020592 A1 | 1/2003 | Hirasawa | |
| 2004/0012480 A1 | 1/2004 | Nakamura et al. | |
| 2004/0196139 A1 | 10/2004 | Nakamura et al. | |
| 2005/0024806 A1 | 2/2005 | Hirasawa | |
| 2008/0265872 A1 * | 10/2008 | Nagashima | ............ G01R 1/203 |
| | | | 324/126 |
| 2009/0174522 A1 | 7/2009 | Schulz et al. | |
| 2013/0221532 A1 | 8/2013 | Fujita et al. | |
| 2014/0125429 A1 * | 5/2014 | Yoshioka | ................ H01C 1/14 |
| | | | 333/172 |

FOREIGN PATENT DOCUMENTS

| | | |
|---|---|---|
| JP | 2005-181056 A | 7/2005 |
| JP | 2008-082957 A | 4/2008 |
| JP | 2009-098079 A | 5/2009 |
| JP | 2011-003694 A | 1/2011 |
| JP | 2012-233706 A | 11/2012 |
| JP | 2014-078538 A | 5/2014 |

* cited by examiner

SHUNT RESISTOR

CROSS REFERENCE TO RELATED APPLICATIONS

This application is the U.S. national stage of International Patent Application No. PCT/JP2015/003977 filed on Aug. 7, 2015 and is based on Japanese Patent Application No. 2014-179482 filed on Sep. 3, 2014, the disclosures of which are incorporated herein by reference.

TECHNICAL FIELD

The present disclosure relates to a shunt resistor to which bonding wires used to detect a current value flowing between electrodes are connected.

BACKGROUND ART

A current value is measured by using a shunt resistor according to a resistance value of a resistive element forming the shunt resistor and a potential difference across the shunt resistor.

A current detection resistor described in Patent Literature 1 includes a current-passing part through which a current flows and detection parts protruding from the current-passing part. The detection parts are provided integrally with the current-passing part and detect a current value according to a resistance value of the current-passing part and a potential difference between two detection parts.

A semiconductor module described in Patent Literature 2 includes a connection conductor functioning as a shunt resistor. Bonding wires are bonded to the connection conductor at leg parts which are in contact with switching elements and a lead frame as connection targets. A current value is detected according to a resistance value of the connection conductor and a potential difference between two bonding wires.

PRIOR ART LITERATURES

Patent Literature

Patent Literature 1: JP2004-221160A
Patent Literature 2: JP2013-179744A

SUMMARY OF INVENTION

A current flowing through a resistive element is increasing recently for a shunt resistor employed in an electronic device equipped to, for example, a vehicle. Accordingly, a heating value of the resistive element is also increasing. A need is thus arising from a viewpoint of heat dissipation to directly connect the shunt resistor to a member having a large heat capacity and relatively high heat conductivity, such as a lead frame.

Nevertheless, according to the technique of Patent Literature 1, machining is not easy because the current-passing part and the detection parts are provided integrally, and also a degree of freedom for a connected-end member is substantially zero because the detection parts are formed in one shape. Hence, the lead frame has to have a space to provide a land pattern of the connected-end member. Such a space may possibly make a required size reduction infeasible.

Meanwhile, according to the technique described in the Patent Literature 2, the leg parts are connected to the connection targets via a connection member, such as solder. A resistance value between connection points of the two bonding wires is susceptible to conditions of the connection member, such as a material, an amount, and a location. A variance in resistance value gives a direct influence to a measurement error of a current value. In short, the configuration in the related art may not achieve a sufficiently high degree of accuracy in measurement of a current flowing through the connection conductor.

In view of the foregoing circumstances, the present disclosure has an object to provide a shunt resistor having a higher degree of accuracy in measurement of a current value.

According to an aspect of the present disclosure, the shunt resistor, at least a part of which has a resistive element with pre-set resistivity, is configured to bridge between two electrodes and detect a current value of a current flowing between the electrodes by detecting a voltage drop in the resistive element. The shunt resistor includes two connecting parts affixed to the electrodes via a conductive adhesive, respectively, and the connecting parts electrically connected to the affixed electrodes, a bridging part bridging between the connecting parts by being extended from one of the connecting parts to the other one of the connecting parts, and two bonding wires used to detect a voltage drop in the resistive element. The bonding wires are bonded to the bridging part.

In the shunt resistor configured as above, wires used to detect a voltage drop in the resistive element are formed of the bonding wires. Hence, a degree of freedom in shape of a connected-end member can be ensured in contrast to a configuration in which detection portions and a current-passing part are formed integrally as in Patent Literature 1. That is to say, even when the connected-end member is a lead frame or the like, a limitation of a land pattern shape can be eased. Hence, the shunt resistor does not limit a reduction of a physical size of a device in which the shunt resistor is installed.

In the shunt resistor configured as above, the connecting parts are connected to the electrodes as connection targets. The connecting parts and the electrodes are connected via the conductive adhesive, such as solder. The bonding wires in the shunt resistor configured as above are bonded to the bridging part bridging between the two connecting parts. Hence, a resistance value between connection points of the two bonding wires is unsusceptible to conditions of the conductive adhesive, for example, condition of solder, such as a material, an amount, and a location. Consequently, a variance in resistance value caused by the conductive adhesive can be restricted and hence accuracy in measurement of a current flowing through the resistive element can be increased.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Hereinafter, embodiments of the present disclosure will be described according to the drawings. In respective drawings referred to in the following, same or equivalent parts are labeled with same reference numerals. Directions referred to in the following are an x direction, a y direction orthogonal to the x direction, and a z direction orthogonal to an x-y plane defined by the x direction and the y direction. That is to say, the x direction, the y direction, and the z direction are linearly independent to one another.

First Embodiment

Firstly, a schematic configuration of a shunt resistor of the present embodiment will be described with reference to FIG. 1.

Figure 1:
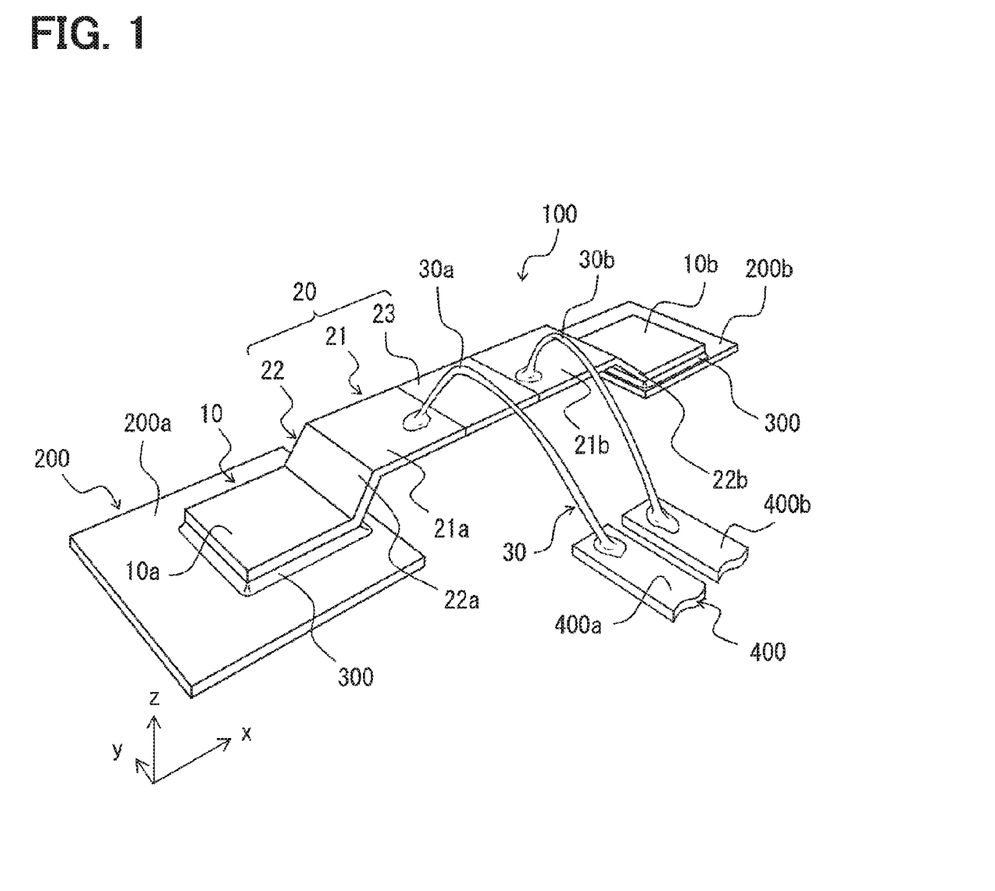
FIG. 1 is a perspective view showing a schematic configuration of a shunt resistor according to a first embodiment.

As is shown in FIG. 1, a shunt resistor 100 has a surface conforming to the x-y plane and electrically connects two electrodes 200 aligned side by side in the x direction to each other. The shunt resistor 100 described herein connects a first electrode 200a and a second electrode 200b. The electrodes 200 may be, for example, lands provided on a board or a lead frame. In short, a configuration of the electrodes 200 is not particularly limited.

The shunt resistor 100 includes two connecting parts 10 connected to the electrodes 200 via solders 300 as a conductive adhesive and a bridging part 20 bridging between the two connecting parts 10. The bridging part 20 has a main part 21, an intermediate part 22, and a resistive element 23. The shunt resistor 100 also includes bonding wires 30 used to detect a current value of a current flowing through the resistive element 23.

As is shown in FIG. 1, the connecting parts 10 have a first terminal 10a connected to the first electrode 200a and a second terminal 10b connected to the second electrode 200b. The connecting parts 10 are shaped like a plane conforming to the x-y plane. Surfaces of the connecting parts 10 opposing the electrodes 200 are connected to the electrodes 200 via the solders 300.

The main part 21 of the bridging part 20 includes a first main part 21a and a second main part 21b, each of which is a plate-like member conforming to the x-y plane. Likewise, the resistive element 23 is provided so as to conform to the x-y plane and sandwiched between the first main part 21a and the second main part 21b. As is shown in FIG. 1, the first main part 21a, the resistive element 23, and the second main part 21b are aligned in the x direction in order of description and bonded to each other to form an integrated conductor as a whole. The conductor integrally formed of the first main part 21a, the resistive element 23, and the second main part 21b is extended in the x direction to electrically connect the first terminal 10a and the second terminal 10b. The main part 21 together with the resistive element 23 is provided at a higher position than the connecting parts 10 in the z direction.

As is shown in FIG. 1, the intermediate part 22 of the bridging part 20 connects the connecting parts 10 and the main part 21. The main part 21 and the connecting parts 10 are provided integrally via the intermediate part 22. More specifically, the first main part 21a and the first terminal 10a are connected via a first intermediate part 22a and the second main part 21b and the second terminal 10b are connected via a second intermediate part 22b. When the shunt resistor 100 is viewed from a front in the y direction, the bridging part 20 corresponds to an upper base and leg parts of substantially a trapezoidal shape. More specifically, the bridging part 20 forms a trapezoidal shape having a plate-like member integrally formed of the main part 21 and the resistive element 23 as an upper base and the intermediate part 22 as leg parts.

The main part 21 and the intermediate part 22 of the bridging part 20 are conductive parts made of metal, for example, copper and have smaller resistivity than the resistive element 23. The resistive element 23 is chiefly made of, for example, CnMnSn or CuMnNi.

The bonding wires 30 are made of a generally known material, for example, aluminum. The bonding wires 30 are connected to sensing electrodes 400 used to detect potential across the bonding wires 30. The bonding wires 30 are a first wire 30a and the second wire 30b. As is shown in FIG. 1, the first wire 30a is bonded to the first main part 21a at a first end and connected to a first sensing electrode 400a as one of the sensing electrodes 400 at a second end. The second wire 30b is bonded to the second main part 21b at a first end and connected to a second sensing electrode 400b as the other one of the sensing electrodes 400 at a second end. That is to say, one end of each bonding wire 30 of the present embodiment is bonded to the main part 21 of the bridging part 20 corresponding to the upper base of substantially a trapezoidal shape.

An operational-effect of the shunt resistor 100 of the present embodiment will now be described with reference to FIG. 2 to FIG. 4.

In the configuration as above, when a potential difference is generated between the first electrode 200a and the second electrode 200b, a current flows through the resistive element 23 by way of the connecting parts 10, the intermediate part 22, and the main part 21. A potential difference observed between the first wire 30a and the second wire 30b depends on bonding positions of the bonding wires 30. Such dependency is attributed in part to a distance between connection positions of the bonding wires 30 in the bridging part 20 or the connecting parts 10. A resistance value between the connection positions increases as the distance becomes longer and hence a potential difference observed between the first wire 30a and the second wire 30b increases, too.

Besides the distance, the dependency is also attributed to conditions of the solders 300, such as an ingredient, an amount, a location, and a shape in a fixed state. In a connection conductor described in Patent Literature 2 (JP2013-179744A), bonding wires are bonded to portions corresponding to the connecting parts 10. The solders 300 are disposed beneath the connecting parts 10. Hence, when a resistance value or a TCR (Temperature Coefficient of Resistance) between the connection positions of the bonding wires 30 fluctuates with the condition of the solders 300, such as an ingredient, an amount, a location, and a shape in a fixed state, an influence appears in a potential difference observed between the first wire 30a and the second wire 30b.

In contrast, in the shunt resistor 100 of the present embodiment, the bonding wires 30 are bonded to the bridging part 20, to be more specific, the main part 21. Because the solders 300 are interposed between the connecting parts 10 and the electrodes 200 as described above, the solders 300 are not in contact with the main part 21. Hence, presence of the solders 300 does not give an influence to a potential difference observed between the first wire 30a and the second wire 30b. That is to say, a variance in potential difference caused by the solders 300 can be restricted and hence a current value of a current flowing through the resistive element 23 can be detected at a higher degree of accuracy.

In the present embodiment, the bonding wires 30 are bonded to the bridging part 20 of substantially a trapezoidal shape at the main part 21 corresponding to the upper base. Because the bridging part 20 has a trapezoidal arch structure, deflection of the bridging part 20 can be restricted against a force acting on the main part 21 from an upper base side to a lower base side. That is to say, because the bonding wires 30 can be bonded in a stable manner, connection reliability can be enhanced.

Further, according to the shunt resistor 100 of the present embodiment, an influence of a magnetic flux induced by a current (main current of FIG. 2 and FIG. 3) flowing between the two electrodes 200 given to a potential difference observed between the first wire 30a and the second wire 30b can be reduced, which will be described in detail in the following.

Figure 2:
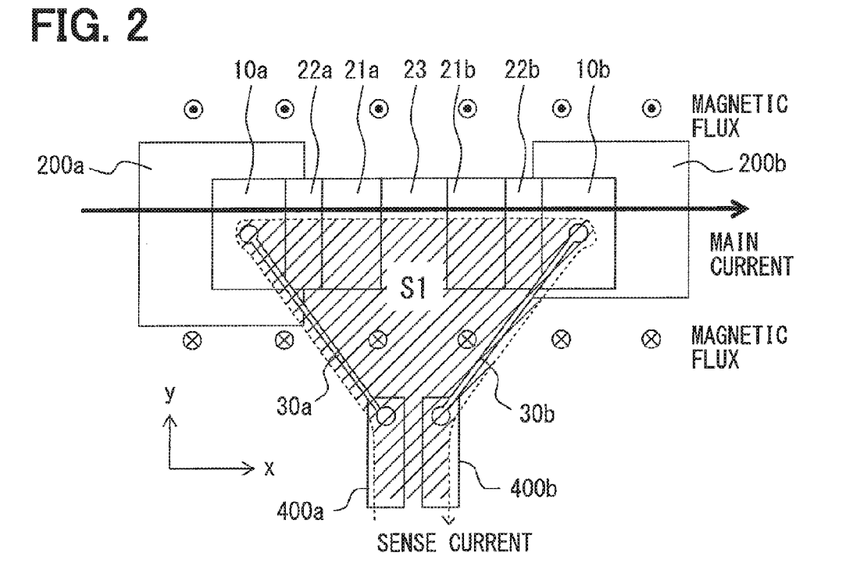
FIG. 2 is a top view showing a relation between a connection configuration of bonding wires and a loop area of a sense current in a shunt resistor according to a configuration in the related art.

FIG. 2 is a top view showing a configuration when the bonding wires 30 are connected to the connecting parts 10 in a manner in the related art. A magnetic flux induced by the main current passes through a region enclosed by a current path of a sense current flowing through the bonding wires 30 (a shaded region of FIG. 2). When the magnetic flux varies with a variance in main current with time, an induced electromotive force is generated in the current path of the sense current, and the induced electromotive force is undesirably superimposed on a potential difference observed between the first wire 30a and the second wire 30b as a noise. The induced electromotive force becomes larger as an area of the region enclosed by the current path of the sense current (hereinafter, referred to as a loop area) becomes larger.

Figure 3:
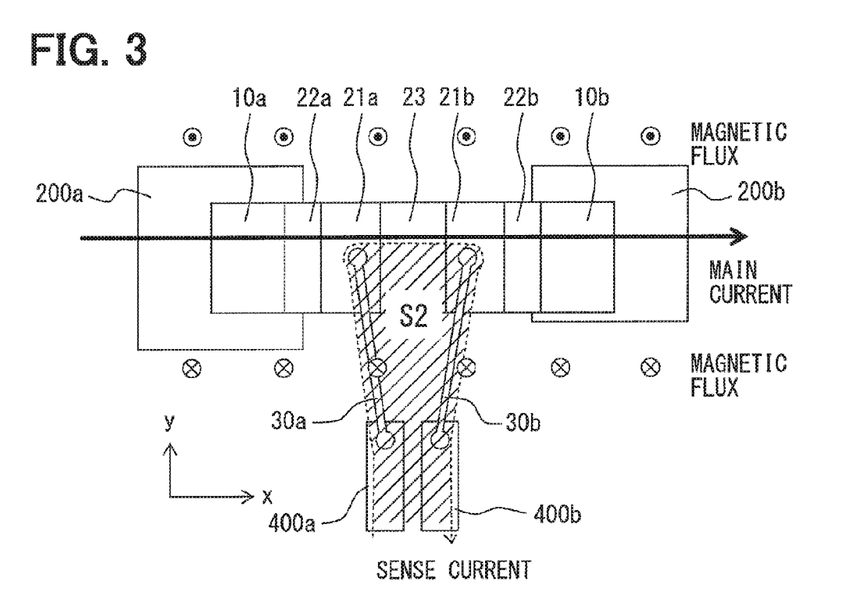
FIG. 3 is a top view showing a relation between a connection configuration of bonding wires and a loop area of a sense current in the shunt resistor according to the first embodiment.

FIG. 3 is a top view showing a configuration of the shunt resistor 100 of the present embodiment. In the shunt resistor 100, the bonding wires 30 are connected to the main part 21 of the bridging part 20. Hence, a loop area S2 of the present embodiment can be smaller than a loop area S1 in the configuration in the related art. Consequently, an induced electromotive force generated in the current path of the sense electrode can be smaller than an induced electromotive force generated in the configuration in the related art, which can in turn reduce an influence of the magnetic flux to a potential difference observed between the first wire 30a and the second wire 30b.

Figure 4:
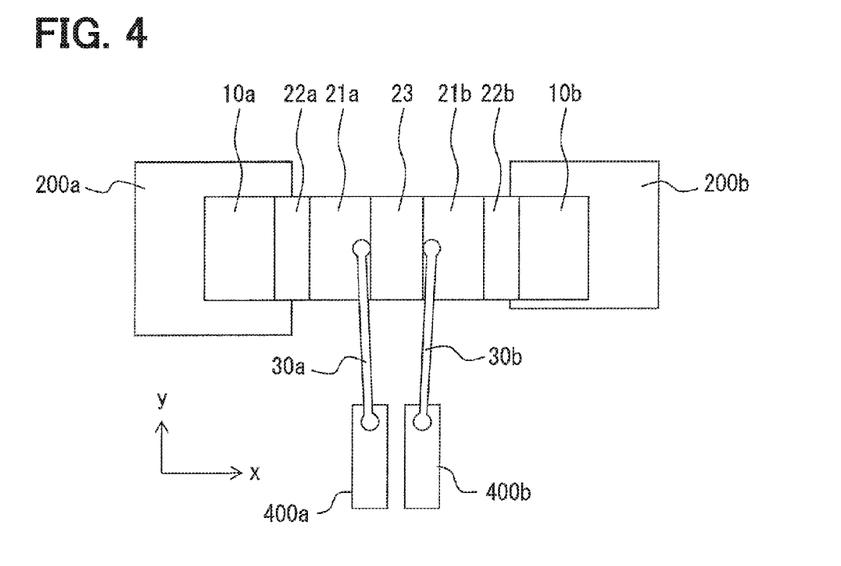
FIG. 4 is a top view showing a schematic configuration of the shunt resistor.

It is preferable to set bonding positions on the main part 21 in close proximity to boundaries between the main part 21 and the resistive element 23 as is shown in FIG. 4, in which case a distance between bonding positions of the first wire 30a and the second wire 30b becomes substantially a minimum in an extending direction of the bridging part 20 (the x direction in FIG. 4).

When configured as in FIG. 4, an influence of a resistance value and a TCR of the conductive parts of the bridging part 20 except for the resistive element 23 given to a potential difference observed between the first wire 30a and the second wire 30b can be substantially a minimum. In addition, because the loop area of the sense current can be reduced, a noise superimposed on a potential difference observed between the first wire 30a and the second wire 30b can be reduced by restricting an induced electromotive force generated due to the main current. In short, a current value of the main current flowing through the resistive element 23 can be detected at a higher degree of accuracy.

Second Embodiment

The first embodiment above has described the bonding wires 30 as to the bonding positions in detail. In the present embodiment, attention is paid to routing of bonding wires 30.

Figure 5:
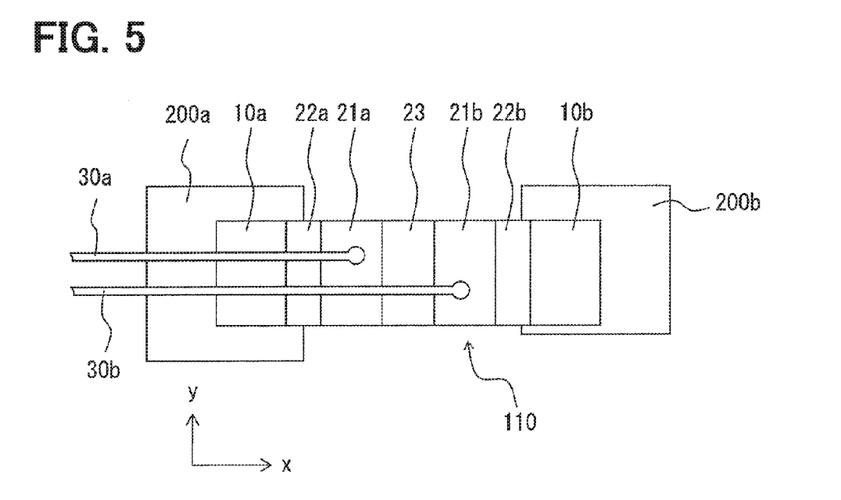
FIG. 5 is a top view showing a schematic configuration of a shunt resistor according to a second embodiment.

As is shown in FIG. 5, two bonding wires 30, namely, the first wire 30a and the second wire 30b, in the shunt resistor 100 of the present embodiment are extracted substantially parallel to an extending direction of the bridging part 20 (an x direction in FIG. 5) to substantially a same direction. Herein, "to a same direction" means that both of the first wire 30a and the second wire 30b are extracted toward a left side on a sheet surface of FIG. 5. That is to say, the first wire 30a and the second wire 30b are extended in the x direction and extracted side by side in a y direction. The present embodiment is of a same configuration as the first embodiment above except for routing of the bonding wires 30.

According to the configuration as above, a distance between the first wire 30a and the second wire 30b can be shorter than in a configuration in which the bonding wires 30 are extracted in a direction (the y direction) substantially orthogonal to the extending direction of the bridging part 20 as in the related art shown in FIG. 2 and in the first embodiment above shown in FIG. 3. Hence, a loop area of a sense current can be reduced further than in the first embodiment above. Consequently, an induced electromotive force generated due to a main current can be restricted, which can in turn reduce a noise superimposed on a potential difference observed between the first wire 30a and the second wire 30b. In short, a current value of the main current flowing through the resistive element 23 can be detected at a higher degree of accuracy.

Figure 6:
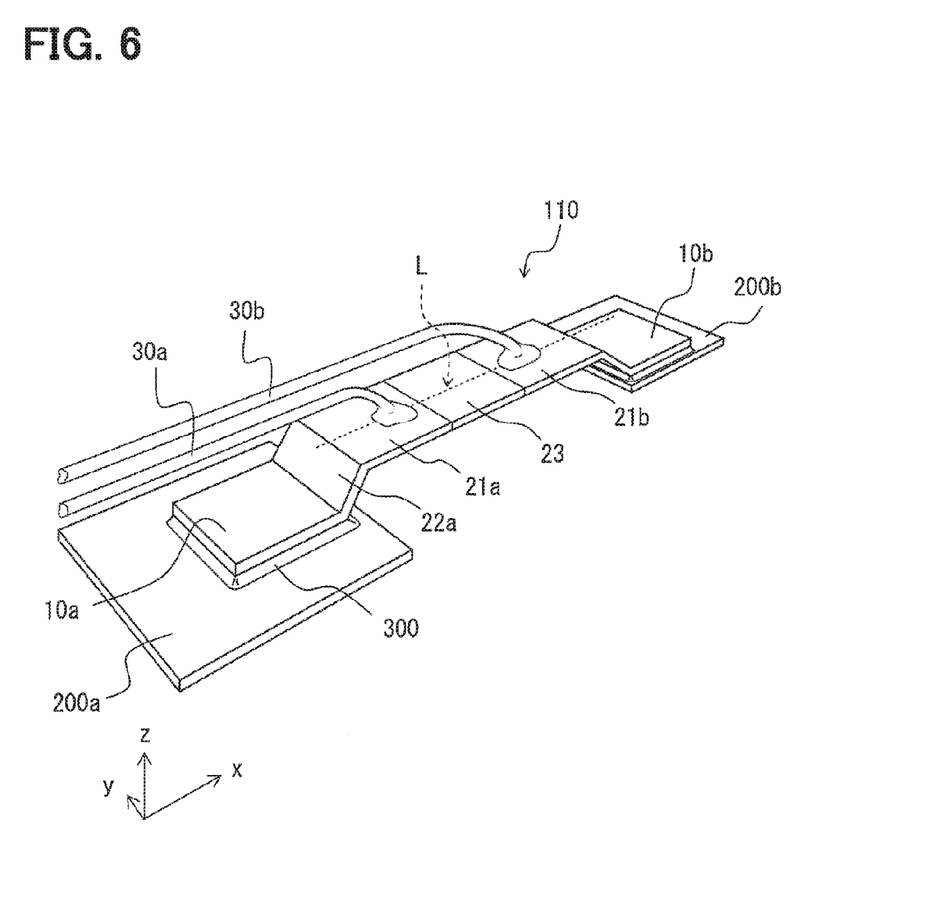
FIG. 6 is a perspective view showing a schematic configuration of the shunt resistor.

When viewed from a front of a bonding surface on which the bonding wires 30 are bonded, that is, when viewed from a front in a z direction shown in FIG. 6, it is preferable to configure in such a manner that bonding positions of the first wire 30a and the second wire 30b on the bonding surface fall on a virtual line L along the extending direction (the x direction). According to the configuration as above, the first wire 30a and the second wire 30b are extended in the x direction and extracted side by side in the z direction.

According to the configuration as above, y coordinates of the first wire 30a and the second wire 30b on the main part 21 coincide with each other, and when viewed in a plane in the z direction, the first wire 30a and the second wire 30b lie one on the other. Hence, the loop area of the sense current can be smaller than in the configuration as shown in FIG. 5 in which the y coordinates are at positions different from each other. Consequently, an induced electromotive force due to the main current can be restricted, which can in turn reduce a noise superimposed on a potential difference observed between the first wire 30a and the second wire 30b.

Other Embodiments

The present disclosure is not limited to the embodiments mentioned above, and can be changed and modified to various embodiments which are also within the spirit and scope of the present disclosure.

Figure 7:
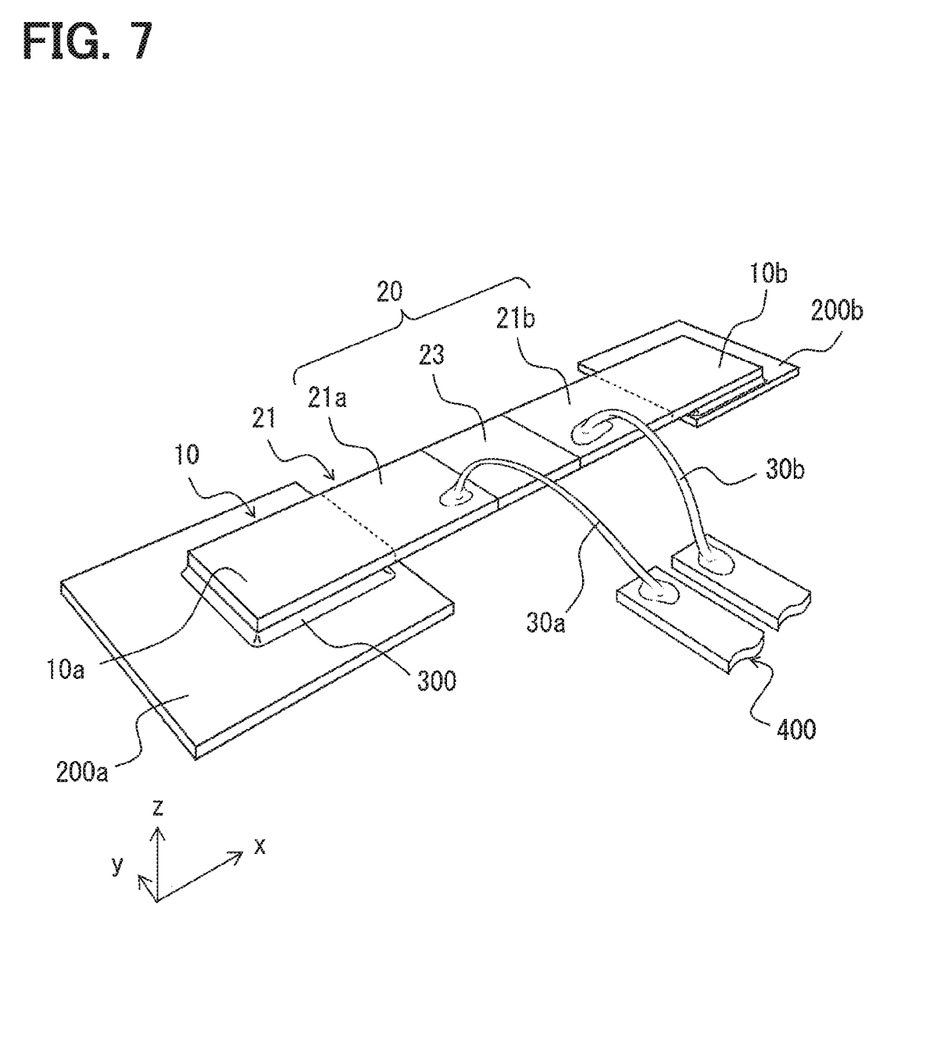
FIG. 7 is a perspective view showing a schematic configuration of a shunt resistor according to another embodiment.

The respective embodiments above have described the configuration in which the bridging part 20 is of substantially a trapezoidal shape when viewed from a front in the y direction by way of example. However, the present disclosure is not limited to the configuration as above. For example, the intermediate part 22 may be of a rectangular shape orthogonal to connecting parts 10 or the intermediate part 22 connecting the connecting parts 10 and the main part 21 may be bent. Further, the present disclosure can be also applied to a configuration as is shown in FIG. 7 in which the bridging part 20 does not have an intermediate part and connecting parts 10, the main part 21, and the resistive element 23 together form a flat plate as a whole. Herein, bonding wires 30 are bonded to the main part 21 not in contact with solders 300.

Accordingly, presence of the solders 300 does not give an influence to a potential difference observed between the first wire 30a and the second wire 30b. That is to say, a variance in potential difference caused by the solders 300 can be restricted and hence a current value of a current flowing through the resistive element 23 can be detected at a higher degree of accuracy.

The respective embodiments above have described a case where the resistive element 23 as a part of the bridging part 20 is sandwiched between the first main part 21a and the second main part 21b. However, the present disclosure is not limited to the described case. The present disclosure can be also applied to a configuration in which connecting parts 10, the main part 21, and the intermediate part 22 are formed integrally using a same material as the resistive element 23. Owing to the configuration to bond bonding wires 30 to portions corresponding to the main part 21, a potential difference observed between the first wire 30a and the second wire 30b becomes unsusceptible to solders 300 and a variance in potential difference caused by the solders 300 can be restricted. According to the configuration as above, a resistance value used to calculate a current value flowing through the resistive element 23 is calculated using resistivity of the resistive element 23, a sectional area of the bridging part 20, and a distance between bonding positions of the bonding wires 30.

The second embodiment above has described a case where the first wire 30a and the second wire 30b are extracted substantially parallel to the extending direction of the bridging part 20 to substantially a same direction. Herein, "substantially parallel" and "substantially a same" do not necessarily mean that the bonding wires 30 have to be extracted perfectly parallel to the extending direction to exactly a same direction. That is to say, the operational-effect described above can be achieved when the first wire 30a and the second wire 30b are extracted in directions substantially parallel to the extending direction of the bridging part 20 and the extracted directions are substantially same.

Figure 8:
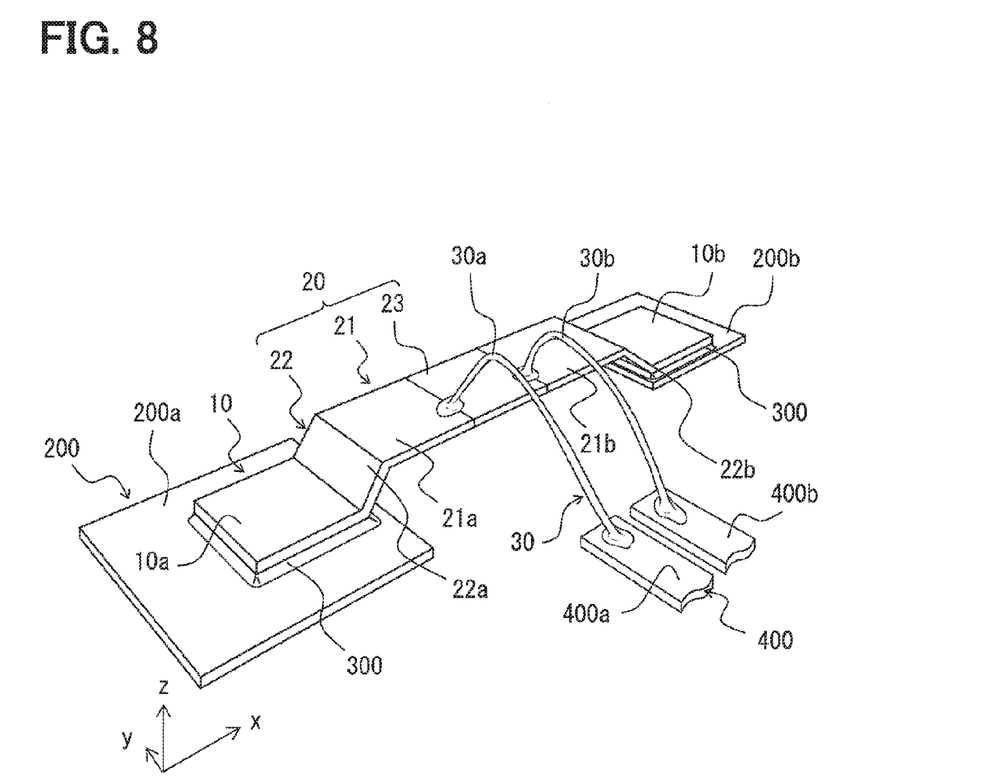
FIG. 8 is a perspective view showing a schematic configuration of a shunt resistor according to still another embodiment.

It is preferable to fix bonding wires 30 at positions as close as possible to boundaries between the resistive element 23 and the main part 21. Further, it should be understood that a configuration as is shown in FIG. 8 in which bonding wires 30 are fixed directly above the boundaries and a configuration in which bonding wires 30 are fixed at positions closer to the resistive element 23 than to the boundaries or on the resistive element 23 are also within the scope of the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A shunt resistor, at least a part of which has a resistive element with pre-set resistivity, and which is configured to bridge between two electrodes and detect a current value of a current flowing between the two electrodes by detecting a voltage drop in the resistive element, the shunt resistor comprising:

two connecting parts affixed to the two electrodes via a conductive adhesive, respectively, and the connecting parts electrically connected to the two electrodes;

a bridging part bridging between the two connecting parts by being extended from one of the two connecting parts to the other one of the two connecting parts; and two bonding wires used to detect a voltage drop in the resistive element, wherein the two bonding wires are bonded to the bridging part, the bridging part is of a protrusion shape with respect to the two connecting parts when viewed in a cross section along an extending direction of the bridging part and orthogonal to a bonding surface on which the two bonding wires are bonded, when viewed in a cross section along the extending direction of the bridging part and orthogonal to the bonding surface on which the two bonding wires are bonded, the bridging part includes an upper base and two leg parts to define a trapezoidal shape, the upper base includes two main parts that have a longer length than the two leg parts, the resistive element is provided at least to the upper base, and the two bonding wires are bonded to the upper base.

2. The shunt resistor according to claim 1, wherein:
the two bonding wires are extracted parallel to an extending direction of the bridging part to a same direction.

3. The shunt resistor according to claim 2, wherein when viewed from a front of a bonding surface on which the two bonding wires are bonded, two bonding positions of the two bonding wires on the bonding surface fall on a virtual line along the extending direction.

4. The shunt resistor according to claim 1, wherein the extending direction is a longitudinal direction of the bridging part.

5. The shunt resistor according to claim 1, wherein the two leg parts attach to the base of the bridging part formed in the trapezoidal shape at an oblique angle.

6. The shunt resistor according to claim 1, wherein the two bonding wires directly contact the resistive element.

7. The shunt resistor according to claim 1, wherein the two leg parts attach to the base of the bridging part formed in the trapezoidal shape at pointed edges.

8. The shunt resistor according to claim 1, wherein
the two leg parts linearly extend from the connecting parts to the main parts of the upper base to form the trapezoidal shape.

9. A shunt resistor, at least a part of which has a resistive element with a pre-set resistivity, and which is configured to bridge between two electrodes and detect a current value of a current flowing between the two electrodes by detecting a voltage drop in the resistive element, the shunt resistor comprising:
two connecting parts affixed to the two electrodes via a conductive adhesive, respectively, and the two connecting parts electrically connected to the two electrodes;
a bridging part bridging between the two connecting parts by being extended from one of the two connecting parts to the other one of the two connecting parts; and
two bonding wires used to detect a voltage drop in the resistive element, wherein
the two bonding wires are bonded to the bridging part,
the bridging part has conductive parts with smaller resistivity than the resistive element and is formed by sandwiching the resistive element between the conductive parts in an extending direction of the bridging part,
the two bonding wires are bonded to the conductive parts sandwiching the resistive element, respectively, and
two bonding positions of the two bonding wires are placed such that a distance between the two bonding positions in the extending direction is a minimum with the resistive element in between such that the two bonding wires directly contact the resistive element.

10. The shunt resistor according to claim 9, wherein the extending direction is a longitudinal direction of the bridging part.

11. The shunt resistor according to claim 9, wherein the two bonding wires are in contact with an upper surface of the resistive element at the two bonding positions, respectively.

12. A shunt resistor, at least a part of which has a resistive element with pre-set resistivity, and which is configured to bridge between two electrodes and detect a current value of a current flowing between the two electrodes by detecting a voltage drop in the resistive element, the shunt resistor comprising:
two connecting parts affixed to the two electrodes via a conductive adhesive, respectively, and the two connecting parts electrically connected to the two electrodes;
a bridging part bridging between the two connecting parts by being extended from one of the two connecting parts to the other one of the two connecting parts, the bridging part including an upper base and a leg part; and
two bonding wires used to detect a voltage drop in the resistive element, wherein the two bonding wires are bonded to the bridging part,
the upper base includes two main parts connected to the resistive element,
the leg part includes two intermediate parts,
one of the two intermediate parts is connected to one of the two main parts and the one of the two connecting parts,
the other one of the two intermediate parts is connected to the other one of the two main parts and the other one of the two connecting parts,
the one of the two main parts has a length greater than a length of the one of the two intermediate parts, and
the other one of the two main parts has a length greater than a length of the other one of the two intermediate parts.

13. The shunt resistor according to claim 12, wherein
the two bonding wires are bonded to the two main parts, respectively.

* * * * *